(12) United States Patent
Lee et al.

(10) Patent No.: US 8,610,452 B2
(45) Date of Patent: Dec. 17, 2013

(54) APPARATUS AND METHOD FOR DIAGNOSING PERMANENT MAGNET DEMAGNETIZATION OF PERMANENT MAGNET SYNCHRONOUS MOTOR, AND APPARATUS FOR DRIVING PERMANENT MAGNET SYNCHRONOUS MOTOR

(75) Inventors: Sang-Bin Lee, Seoul (KR); Jong-Man Hong, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 799 days.

(21) Appl. No.: 12/766,670

(22) Filed: Apr. 23, 2010

(65) Prior Publication Data

US 2011/0260748 A1 Oct. 27, 2011

(51) Int. Cl.
*G01R 31/34* (2006.01)
*G01R 33/12* (2006.01)
*G01R 31/02* (2006.01)

(52) U.S. Cl.
USPC ............ 324/765.01; 324/205; 318/490

(58) Field of Classification Search
USPC ............ 324/765.01, 205; 318/490
See application file for complete search history.

(56) References Cited

U.S. PATENT DOCUMENTS

| | | | |
|---|---|---|---|
| 5,650,706 A * | 7/1997 | Yamada et al. | 318/701 |
| 6,573,745 B2 * | 6/2003 | Raftari et al. | 324/765.01 |
| 6,720,792 B2 * | 4/2004 | Raftari et al. | 324/765.01 |
| 6,873,152 B2 * | 3/2005 | Kliman et al. | 324/241 |
| 7,952,346 B2 * | 5/2011 | Helle et al. | 324/207.25 |
| 8,080,960 B2 * | 12/2011 | Rozman et al. | 318/400.33 |
| 8,314,576 B2 * | 11/2012 | Fahimi et al. | 318/400.21 |
| 8,421,292 B2 * | 4/2013 | Natsumeda et al. | 310/156.43 |
| 8,436,507 B2 * | 5/2013 | Chien et al. | 310/268 |
| 2009/0001996 A1 * | 1/2009 | Rahman et al. | 324/623 |
| 2013/0063066 A1 * | 3/2013 | Fish | 318/490 |
| 2013/0169392 A1 * | 7/2013 | Mongeau | 335/284 |

OTHER PUBLICATIONS

Roux, et al, Detecting Rotor Faults in Permanet Magnet Synchronous Machines, 2003, Symposium on Diagnostic for Electric Machines, Power Electronics and Devices, pp. 198-203.*
Wiehan Leroux, et al; "Detecting Rotor Faults in Low Power Permanent Magnet Synchronous Machines", IEEE Transactions on Power Electronics, vol. 22, No. 1, Jan. 8, 2007, pp. 322-328.

(Continued)

*Primary Examiner* — Joshua Benitez-Rosario
(74) *Attorney, Agent, or Firm* — Ladas & Parry LLP

(57) ABSTRACT

Provided are an apparatus and a method for diagnosing permanent magnet demagnetization of a permanent magnet synchronous motor. The apparatus includes a magnetic field generating unit, a stator current measuring unit, and a demagnetization diagnosing unit. The magnetic field generating unit generates magnetic fields of which directions are respectively parallel to a predetermined direction among a plurality of directions passing through a rotation axis of a rotor, on a plane vertical to the rotation axis of the rotor which is in a standstill. The stator current measuring unit measures currents which flow in a stator winding in correspondence with the respective generated magnetic fields. The demagnetization diagnosing unit compares a predetermined reference value and a comparison value which is calculated on the basis of the magnitudes of the stator winding currents which are measured in correspondence with the respective generated magnetic fields to diagnose demagnetization of a permanent magnet attached to the rotor.

14 Claims, 5 Drawing Sheets

(56) References Cited

OTHER PUBLICATIONS

Satish Rajagopalan, et al; "Dynamic Eccentricity and Demagnetized Rotor Magnet Detection in Trapezoidal Flux (Brushless DC) Motors Operating Under Different Load Conditions", IEEE Transactions on Power Electronics, vol. 22, No. 5, Sep. 10, 2007, pp. 2061-2069.

Nobuyuki Matsui, et al; "A Novel Starting Method of Sensorless Salient-Pole Brushless Motor", Conference Record of the 1994 IEEE Industry Applications Society Annual Meeting, Oct. 2-6, 1994, Denver, CO, vol. 1, pp. 386-392.

Peter B. Schmidt, et al; "Initial Rotor Angle Detection of a Non-Salient Pole Permanent Magnet Synchronous Machine", IEEE Industry Applications Society Annual Meeting, New Orleans, Louisiana, Oct. 5-9, 1997, pp. 459-463.

Jongman Hong, et al; "Automated Monitoring of Magnet Quality for Permanent Magnet Synchronous Motors at Standstill", ECCE 2009, IEEE Energy Conversion Congress and Exposition, 2009, pp. 2326-2333, Sep. 20-24, 2009.

* cited by examiner

APPARATUS AND METHOD FOR DIAGNOSING PERMANENT MAGNET DEMAGNETIZATION OF PERMANENT MAGNET SYNCHRONOUS MOTOR, AND APPARATUS FOR DRIVING PERMANENT MAGNET SYNCHRONOUS MOTOR

BACKGROUND

The present disclosure relates generally to permanent magnets, and more particularly, to an apparatus and a method for diagnosing permanent magnet demagnetization of a permanent magnet synchronous motor, and an apparatus for driving a permanent magnet synchronous motor.

Permanent magnet synchronous machines (PMSM) have recently become the preferred choice for a variety of applications due to their high power density, high efficiency, and ease of control. The permanent magnet rotor is one of the most critical components in a PMSM that determines the performance, efficiency, and reliability of the motor drive system. Local or uniform demagnetization of the PM can occur due to a combination of extreme thermal, electrical, mechanical, and environmental operating stresses and results in irreversible degradation of motor performance and efficiency. When the operating point of a permanent magnet, which operates at the intersection between a demagnetization curve of the PM and a load line, is driven below the knee of the curve due to demagnetizing magnetomotive force or under normal conditions with change in operating temperature, the operating point does not retrace the demagnetization curve and according irreversible demagnetization occurs. In addition, rare-earth magnet materials are susceptible to metallurgical structure changes due to corrosion or oxidation, and this also results in demagnetization. Other possible causes of demagnetization include gradual decrease in magnet strength (domain relaxation) and damage (chipping, cracking, etc. . . . ) due to vibration, shock, or mechanical forces during operation.

If the magnet is exposed to an elevated temperature for a long period of time, it can be demagnetized permanently due to changes in the metallurgical structure, which may impair its ability to be re-magnetized. If the temperature of the magnet exceeds the Curie temperature of the material, the magnetization is reduced to zero (the material can be re-magnetized, if the metallurgical structure has not been altered).

The metallurgical/structural changes of permanent magnet may arise due to the corrosion or oxidation of the surfaces of the permanent magnet as well as a high temperature. Particularly, an NdFeB magnet is vulnerable to corrosion or oxidation due to its material characteristics. The oxidized portion of the permanent magnet with structural change grows with time, especially at elevated temperature and/or under humid or chloride containing environments. The portion with structural change is more easily demagnetized (lower flux density and coercivity), and is more brittle and may lead to total disintegration in extreme cases. As the coercivity of the permanent magnet is reduced, the magnetic flux of the permanent magnet decreases, and consequently the magnetic force becomes weaker.

Moreover, when a reverse-direction magnetic field caused by a fault current exceeds the coercivity (Hc) of a permanent magnet, the permanent magnet may be demagnetized. As an example, when a motor is run, a high fault current flows in a winding due to, for example, a short circuit switch of an inverter or a short that is caused by a breakdown in the insulation between the turns of a motor winding. This high fault current causes the demagnetization of the permanent magnet included in the motor. Furthermore, a shift in the level of a load applied to a permanent magnet or a shift in the operating point of the permanent magnet caused by temperature can have an adverse affect on the permanent magnet. For example, when the degree of change of the operating point of the permanent magnet falls outside of a certain range, a loss of magnetic energy is incurred. The loss of the magnetic energy is maintained as-is even when the load or the temperature returns to its initial state and thus permanent demagnetization occurs.

In this way, permanent magnets may be demagnetized or damaged by the complex effects of various causes, and such cases are typically monitored while motors are actually being run. When a permanent magnet is demagnetized, the torque and efficiency of a motor decrease, and performance is greatly deteriorated. Since this leads to failure of the motor and may thereby exert an adverse influence on the entire motor driving system, diagnosing the condition of the permanent magnets is essential for the reliability, efficiency and stability of the system.

One method for directly diagnosing the condition of a permanent magnet is to monitor the magnetic flux distribution of the magnet. This method requires disassembly of the motor which in turn incurs the opportunity cost of time because the motor must be stopped for a long period of time and disassembled. An additional drawback of such a method is the high-cost of measurement equipment and assembly/disassembly. In view of these constraints, a method for indirectly analyzing the condition of a magnet may be considered more preferable than a method requiring disassemble of the motor in the diagnosis of permanent magnets.

One method of indirectly analyzing the condition of a magnet is a method for indirectly measuring magnetic flux through the winding of a stator. If a voltage induced in a winding is measured when a motor rotates at a constant speed, since the voltage is induced in proportion to magnetic flux, the magnetic flux of a magnet can be measured. However, such a method requires that the load be disconnected from the motor, another motor be connected to the motor to be diagnosed, and the connected motor be rotated at a constant speed. Consequently, the method has difficulties. Furthermore, there is a method that estimates the magnetic flux of a motor based on an equivalent model of the motor while the motor is being run. However, this method requires accurate knowledge of the resistance and inductance of the motor. In addition, high-cost equipment is required for measuring such parameters, and moreover, it is difficult to obtain accurate and consistent results because the parameters vary according to temperature and saturation of the core.

SUMMARY

Embodiments of the present invention include an apparatus and a method for diagnosing condition of a permanent magnet in a permanent magnet synchronous motor easily without requiring separate equipment and disassembly of the motor The present disclosure also provides a driving apparatus of a permanent magnet synchronous motor allowing for easy diagnosis of the condition of the permanent magnet without requiring additional hardware outside the hardware configuration of the driving apparatus of a permanent magnet synchronous motor.

According to an exemplary embodiment of the present invention, an apparatus for diagnosing a permanent magnet demagnetization of a permanent magnet synchronous motor includes: a magnetic field generating unit generating magnetic fields of which directions are respectively parallel to a predetermined direction among a plurality of directions passing through a rotation axis of a rotor, on a plane vertical to the rotation axis of the rotor which at standstill; a stator current measuring unit measuring values of currents which flow in a stator winding in correspondence with the respective generated magnetic fields; and a demagnetization diagnosing unit comparing a predetermined reference value and a comparison value to diagnose demagnetization of a permanent magnet attached to the rotor, the comparison value being calculated on the basis of the magnitudes of the stator winding currents measured in correspondence with the respective generated magnetic fields.

According to another exemplary embodiment, a method for diagnosing a permanent magnet demagnetization of a permanent magnet synchronous motor includes: generating magnetic fields of which directions are respectively parallel to a predetermined direction among a plurality of directions passing through a rotation axis of a rotor, on a plane vertical to the rotation axis of the rotor which is at standstill; measuring currents which flow in a stator winding in correspondence with the respective generated magnetic fields; and comparing a predetermined reference value and a comparison value to diagnose demagnetization of a permanent magnet attached to the rotor, the comparison value being calculated on the basis of the magnitudes of the stator winding currents measured in correspondence with the respective generated magnetic fields.

According to yet another exemplary embodiment, an apparatus for driving a permanent magnet synchronous motor includes: a driving unit selectively controlling supply of a power source having a certain frequency to a stator winding that includes a plurality of windings which are disposed at certain intervals in a stator of the permanent magnet synchronous motor; a current measuring unit measuring a current which flows in the stator winding; and a controller controlling the driving unit on the basis of the current which is measured by the current measuring unit to drive the permanent magnet synchronous motor, or diagnosing demagnetization of a permanent magnet of the permanent magnet synchronous motor, wherein when the controller operates in a diagnosis mode for diagnosing demagnetization of the permanent magnet comprised in the permanent magnet synchronous motor, the controller controls the driving unit to cause generation of magnetic fields of which directions are respectively parallel to a predetermined direction among a plurality of directions passing through a rotation axis of a rotor, on a plane vertical to the rotation axis of the rotor which is in a standstill, and compares a predetermined reference value and a comparison value to diagnose demagnetization of the permanent magnet attached to the rotor, the comparison value being calculated on the basis of magnitudes of currents which flow in the stator winding in correspondence with the respective generated magnetic fields.

BRIEF DESCRIPTION OF THE DRAWINGS

Exemplary embodiments can be understood in more detail from the following description taken in conjunction with the accompanying drawings, in which.

DETAILED DESCRIPTION OF EMBODIMENTS

Hereinafter, specific embodiments of an apparatus and a method for diagnosing permanent magnet demagnetization of a permanent magnet synchronous motor and an apparatus for driving a permanent magnet synchronous motor will be described in detail with reference to the accompanying drawings.

Figure 1:
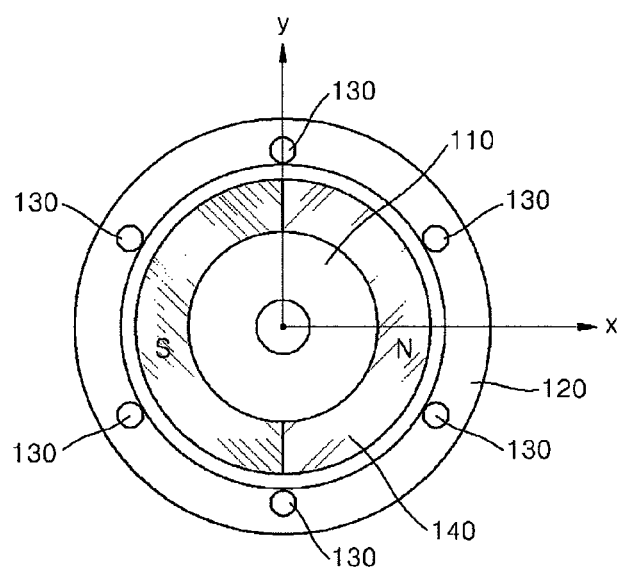
FIG. 1 is a diagram illustrating the structure of a Permanent Magnet Synchronous Motor (PMSM)

FIG. 1 is a diagram illustrating the structure of a Permanent Magnet Synchronous Motor (PMSM).

Referring to FIG. 1, the PMSM may include a rotor 110 and a stator 120. A Permanent Magnet (PM) may be attached to the rotor 110. A stator winding 130 may be wound around the stator 120. The rotor 110 may rotate due to magnetic flux generated by the stator flux 130 and magnetic flux generated by the PM 140. The torque exerted on the rotor 110 may be in proportion to the outer product of the magnetic flux by the stator winding 130 and the magnetic flux by the PM 140. The magnetic flux generated by the PM 140 travels from the N-pole to the S-pole, and the magnetic flux generated by the stator winding 130 rotates around the rotating axis of the rotor 110 in a clockwise or counterclockwise direction. The magnitude of the magnetic flux generated by the stator winding 130 may be the sum of magnetic fluxes generated by a current flowing in the respective stator windings 130. On the other hand, the rotating speed of the rotor 110 may be in proportion to the frequency of an input voltage. In order to rotate the PMSM at a desired speed, the input frequency needs to be freely adjusted. For this, a driving system may be configured with an inverter.

Figure 2:
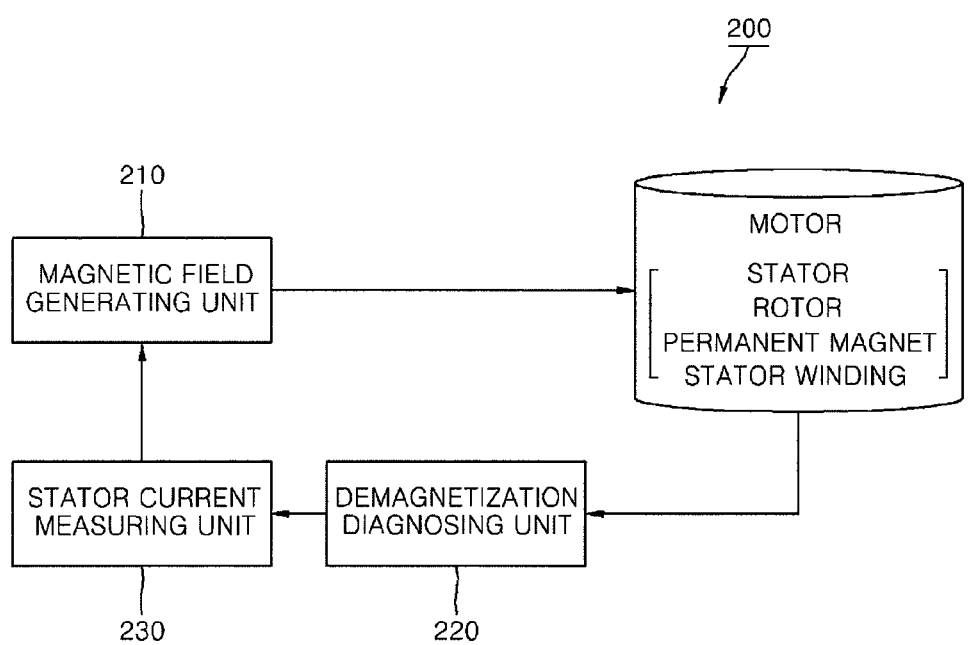
FIG. 2 is a diagram illustrating an apparatus for diagnosing demagnetization of a Permanent Magnet (PM) of a PMSM according to an exemplary embodiment of the present invention.

FIG. 2 is a diagram illustrating an apparatus for diagnosing demagnetization of a PM of a PMSM according to an embodiment of the present invention.

Referring to FIG. 2, a PM demagnetization diagnosing apparatus 200 of the PMSM may include a magnetic field generating unit 210, a stator current measuring unit 220, and a demagnetization diagnosing unit 230.

The magnetic generating unit 210 may generate magnetic fields corresponding respectively to a plurality of directions passing the rotation axis of the rotor 110 on a plane vertical to the rotation axis of the rotor 110 when the rotor 110 of the PMSM is at standstill. When the PMSM is driven by a three-phase voltage as shown in FIG. 2, the magnetic fields corresponding to the plurality of directions may be the vector sum of magnetic field components corresponding to the directions of the magnetic fields generated by voltages applied to each phase of the stator winding 130. In this case, the magnetic field generated by the magnetic field generating unit 210 may be an alternating magnetic field generated in different directions for one generation of the magnetic field, or may be a direct current pulse magnetic field generated in a single direction for one generation of the magnetic field. Also, the magnetic field generating unit 210 may control the magnitude and duration of the voltage applied to the stator winding 130 to prevent torque from being generated in the rotor 110.

The frequency of generation of the magnetic field by the magnetic field generating unit 210 may vary according to whether or not the initial position (i.e., a position of a straight line from the center of the N-pole to the center of the S-pole of the PM 140) of the PM 140 is known.

For example, when the PM 140 is located as shown in FIG. 1, and an alternating voltage is applied to the stator winding 130-1 located at an angle of about 90° or about 270° in a counterclockwise direction around the rotation axis of the rotor 110 with respect to a straight line through the center of the N-pole and the center of the S-pole, an alternating magnetic field may be generated in directions of about 0° and about 180°. The same applies when a direct current pulse voltage is applied instead of an alternating magnetic field. In this case, direct current pulse magnetic fields may be generated in directions of about 0° and about 180°, respectively. Accordingly, demagnetization of a PM may be diagnosed by measuring the magnitude of the current flowing in the stator winding 130 using one generation of an alternating magnetic field in directions of about 0° and about 180° and two generations of direct current pulse magnetic fields in directions of about 0° and about 180°, respectively.

In the case in which the initial position of the PM 130 is unknown, the magnetic field generating unit 210 may generate an alternating magnetic field at intervals of the same angle within the range of about 0° to about 180° around the rotation axis of the rotor 110. Of course, when a direct current pulse magnetic field is generated, the magnetic field generating unit 210 may generate a magnetic field at intervals of the same angle within a range of about 0° to about 360° around the rotation axis of the rotor 110. In both cases (the alternating magnetic field and the direct current pulse magnetic field), the angle of the magnetic field generated by the magnetic field generating unit 210 may vary every generation of the magnetic field.

The stator current measuring unit 220 may measure currents flowing in a stator winding in correspondence with the respective generated magnetic fields. Accordingly, when a generated magnetic field is an alternating magnetic field, the stator current measuring unit 220 may output values of two currents having opposite directions in correspondence with one generation of the alternating magnetic field. In contrast, when the generated magnetic field is a direct current pulse magnetic field, the stator current measuring unit 220 may output a value of one current in correspondence with one generation of a direct current pulse magnetic field.

The demagnetization diagnosing unit 230 may compare comparison values with predetermined reference values in order to diagnose demagnetization of the PM 140 attached to the rotor 110. The comparison values are calculated on the basis of the currents of the stator winding 130 measured in correspondence with the respective generated magnetic fields. The predetermined reference values are determined in correspondence with the directions of the respective magnetic fields. When the generated magnetic field is an alternating magnetic field, the reference values may be determined on the basis of one of the two directions of the magnetic fields generated in correspondence with one generation of the alternating magnetic field. Also, when the generated magnetic field is a direct current pulse magnetic field, the reference values may be determined on the basis of the direction of the magnetic field generated in correspondence with one generation of the direct current pulse magnetic field. The diagnosis of demagnetization of the PM 140 by the demagnetization diagnosing unit 230 may be performed using the current values obtained by the stator current measuring unit 220 or alternatively by various parameters calculated on the basis of the current values. Examples of parameters calculated on the basis of the current values include n-order harmonic component, power, and impedance.

Hereinafter, a configuration for the demagnetization diagnosing unit 230 for diagnosing demagnetization of the PM 140 using the current value itself according to an exemplary embodiment will be described in detail. In the case where the current value itself is used, the demagnetization diagnosing unit 230 may diagnose the PM 140 as being demagnetized when the predetermined reference value differs from the value of the difference (difference value) between magnitudes of the currents of the stator winding 130 measured in correspondence with respective magnetic fields having opposing directions. Also, the demagnetization diagnosing unit 230 may diagnose the PM 140 as being demagnetized when a certain order harmonic component (e.g., 3-order harmonic component) of the current of the stator winding 130 measured in correspondence with the respective magnetic fields differs from the predetermined reference value. For more exact diagnosis, the demagnetization diagnosing unit 230 may calculate the current values corresponding to the respective magnetic field directions by adding values obtained by performing an axis transformation to extract only components matching the directions of the magnetic fields pertaining to the measured current. Furthermore, the diagnosis result by the demagnetization diagnosing unit 230 may be outputted to the outside through a user interface (not shown). In this case, the user interface may include sound output devices for outputting an alarm sound to inform that the PM 140 has been demagnetized and display devices for outputting the degree of demagnetization and demagnetized locations of the PM 140.

Figure 3:
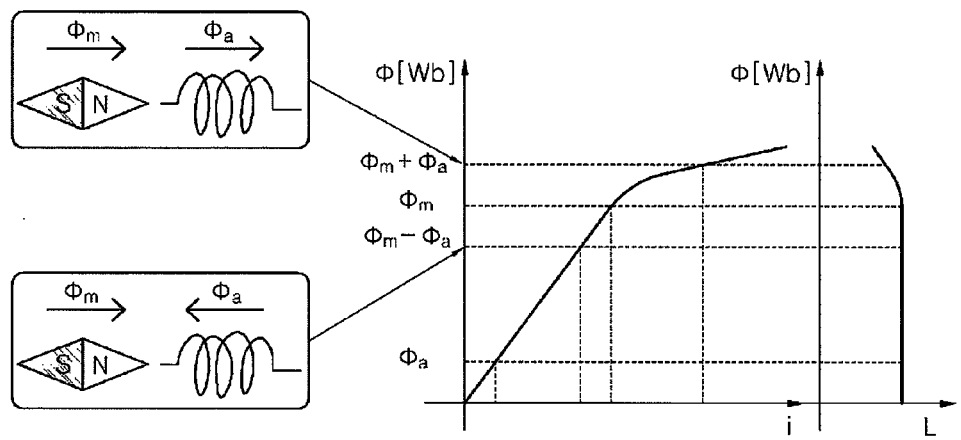
FIG. 3 is a graph illustrating magnetic saturation and equivalent inductance of a core according to a relative direction between magnetic flux generated by a coil and a PM.

FIG. 3 is a graph illustrating magnetic saturation and equivalent inductance of a core according to the relative direction between magnetic flux generated by a coil and by a PM.

Figure 4:
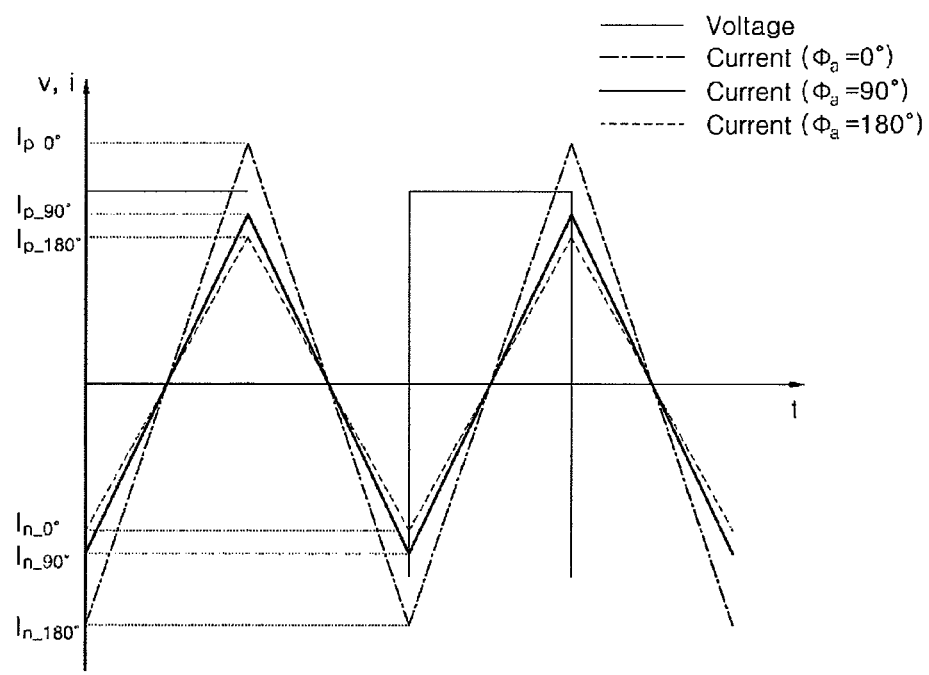
FIG. 4 is a diagram illustrating a relative direction between the magnetic flux of the PM and the magnetic flux generated by the alternating magnetic fields.

Referring to FIG. 3, if magnetic flux $\Phi_a$ of the coil is pointing in the same direction as magnetic flux $\Phi m$ of the PM, the equivalent inductance is decreased due to saturation of the core by superposition of the two magnetic fluxes, and a current is increased in result. In contrast, if the magnetic flux $\Phi_m$ of the PM is pointing in the opposite direction to the magnetic flux $\Phi_a$ of the coil, the equivalent inductance is decreased due to cancellation of the two magnetic fluxes, and a current is decreased in proportion to the reduction of the flux resultantly. FIG. 4 is a diagram illustrating stator current waveform according to the relative direction between the magnetic flux of the PM and the magnetic flux generated by the alternating magnetic fields. Referring to FIG. 4, if the direction of the magnetic flux of the PM is perpendicular to that of the alternating magnetic fields (i.e., $\Phi_a=90°$), the maximum value of the current pattern $i_p$ is equal to the minimum value of the current pattern $i_n$, as the magnetic flux of the PM has no effect on the coil. On the other hand, if the angle between the direction of the magnetic flux of the PM and that of the alternation magnetic fields is 0 degrees (i.e., $\Phi_a=0°$), the core is saturated in the case in which a current of positive direction flows and is not in the case in which a current of negative direction flows. Therefore, the maximum value of the current pattern $i_p$ is highly increased and the minimum value of the current pattern $i_n$ is slightly increased. Meanwhile, if the angle between the direction of the magnetic flux of the PM and that of the alternation magnetic fields is 180 degree (i.e., $\Phi_a=180°$), the core is saturated in a case in which a current of negative direction flows and is not in a case in which a current of positive direction flows. Therefore, the minimum value of the current pattern $i_n$ is highly decreased and the maximum value of the current pattern $i_p$ is slightly decreased In this situation, the sum of the maximum and minimum values of the current pattern may be considered proportionate to the degree of the saturation of the core, which may be used as a criterion indicating the magnetic flux of the PM.

As described with reference to FIGS. 3 and 4, the current waveform characteristics relating to the relative direction between the magnetic flux by the coil and by the PM may also be equally applied to a relative direction between the magnetic field generated by the magnetic field generating unit 210 and the PM 140 attached to the rotor 110 of the motor. Referring to FIGS. 1-2, in the motor at standstill, when the magnetic field generating unit 210 applies a voltage to the stator winding 130 to generate magnetic fields in counterclockwise directions of about 0° and about 180° from the x-axis, positive and negative currents may flow in the stator winding 130 in correspondence with the respective magnetic fields. In this case, the waveform of the current flowing in the stator winding 130 may be identical in principle to the waveform of the current shown in FIG. 4. Also, when the magnetic field generating unit 210 applies a voltage to the stator winding 130 to generate magnetic fields in counterclockwise directions of about 90° and about 270° from the x-axis, positive and negative currents having the same magnitude may flow in the stator winding 130 in correspondence with the respective magnetic fields. When obtaining a difference value between the magnitude of the positive current and the magnitude of the negative current while increasing the angle of the alternating magnetic field, the waveform shown in FIG. 6 may be obtained in the synchronous motor having a normal magnet. Here, the magnitudes of the positive current and the negative current corresponding to the respective angles may be the sum of the magnitudes of the current components (i.e., magnetic field direction components of the respective currents flowing in the stator winding 130) that are axially transformed with respect to the respective currents flowing in the stator winding 130. The reason for axially transforming the current is that these magnetic field direction current components are most significantly changed by the magnetic flux of the PM when compared to respective phase currents. However, it is possible to find the magnitude of the magnetic flux of the PM using the respective phase currents.

A method of using difference in current due to saturation of the core may be used for measurement of the initial position of the PMSM, and a direct current pulse magnetic field may be used in such a method. An alternating current magnetic field may be used rather than the direct current pulse magnetic field in order that torque is not generated at the axis of the motor during the diagnosis. Further, when the PM is uniformly demagnetized on the whole, the core of the uniformly demagnetized PM is less saturated by alternating magnetic fields of the same magnitude than is a normal magnet. In such a case, the difference value between the magnitude of the positive current and the magnitude of the negative current on the whole is reduced when compared to the case of a normal PM. Also, when the PM is locally demagnetized or damaged, the difference value between the magnitude of the positive current and the magnitude of the negative current may be reduced only in a locally demagnetized or damaged area.

Figure 5:
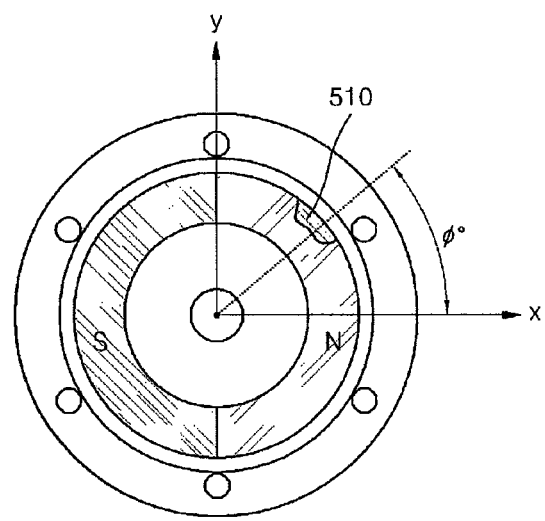
FIG. 5 is a diagram illustrating a locally-damaged PM.
Figure 6:
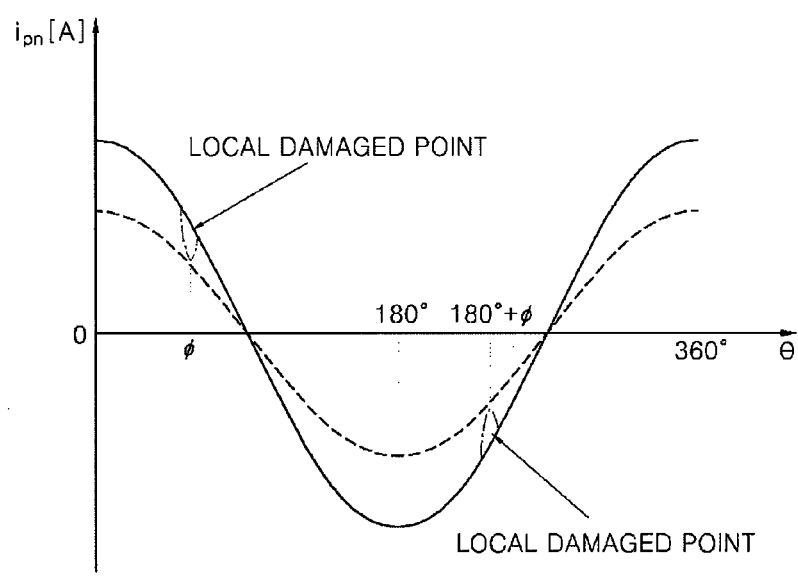
FIG. 6 is a graph illustrating change of the sum of the current values, which respectively correspond to each direction of an alternating magnetic field, measured as a function of the pulsating flux vector angle for magnets with uniform and local demagnetization.

FIG. 5 is a diagram illustrating a locally-damaged PM. FIG. 6 is a graph illustrating change of the sum of the current values, which respectively correspond to each direction of alternating magnetic fields, measured as a function of the pulsating flux vector angle for magnets with uniform and local demagnetization.

Referring to FIGS. 5 and 6, when alternating magnetic fields are generated while continuously increasing the angle from the x-axis in a non PM, the difference value between the magnitude of the positive current and the magnitude of the negative current flowing in the stator winding may show a variation like the solid line shown in FIG. 6. When alternating magnetic fields are generated while continuously increasing the angle from the x-axis in a uniformly demagnetized PM, the difference value between the magnitude of the positive current and the magnitude of the negative current flowing in the stator winding may show a variation like the dotted line shown in FIG. 6. Accordingly, in the normal PM, the difference value between the magnitude of the positive current and the magnitude of the negative current flowing in the stator winding is set to a reference value in correspondence with the generation angles of the respective alternating magnetic fields. Regarding the PMSM, when the difference value between the magnitude of the positive current and the magnitude of the negative current measured from the stator winding differs from the reference value determined in correspondence with the generation angles of the respective alternating magnetic fields, the PM is determined as being demagnetized. In this case, a demagnetized location of the PM may be accurately detected based on the absolute changes of the difference values between the magnitude of the positive current and the magnitude of the negative current measured from the stator winding in correspondence with the generation angles of the respective alternating magnetic fields. When the PM is partially damaged at point 510 of the PM, which is $\Phi°$ from the x-axis, the difference value between the magnitude of the positive current and the magnitude of the negative current flowing in the stator winding in correspondent with the alternating magnetic fields that are generated at different angles may be considerably smaller than the reference value at the damaged point 510, but may be equal to the reference value at other points.

Based on the principle described above, the PM demagnetization diagnosing apparatus 200 of the PMSM according to an embodiment of the present invention may diagnose the demagnetization of the PM by measuring the degree of variation and distortion of the difference value between the magnitudes of the positive current and the negative current flowing in the stator winding according to the variation of the phase angle of the alternating magnetic fields. A direct current pulse magnetic field may also be used instead of the alternating magnetic field. The demagnetization of the PM may be diagnosed based on the degree of variation and distortion of the sum or the difference between the magnitudes of a current flowing when the direct current pulse voltage is applied at an angle of about θo from the x-axis and a current flowing when the direct current pulse voltage is applied at an angle of about (θ+180)° or about (θ−180)° from the x-axis. In this case, the demagnetization of the PM may be diagnosed by comparing the respective currents with respect to an arbitrary angle and the opposite angle thereof regardless of order or a method of changing the angle θ of the direct current pulse magnetic field. Here, the diagnosis method may be similar to the case where the alternating magnetic field is applied.

On the other hand, the diagnosis of demagnetization of the PM may be performed by methods other than the method of using variations in the difference between the magnitudes of the positive current and the negative current flowing in the stator winding as described above. In an exemplary embodiment, when the PM is demagnetized, the average value of the magnitudes of the positive current and the negative current flowing on the stator winding is reduced. Also, the magnitude of a specific harmonic component (for example, third harmonic) of the positive current and the negative current flowing in the stator winding may be reduced as the demagnetization of the PM progresses. Accordingly, when the difference value between the average values of the magnitudes of the positive current and the negative current of the stator current differs from a predetermined reference value or a specific harmonic component differs from a predetermined reference value in respective correspondence with the generation directions of a plurality of magnetic fields, the PM may be diagnosed as being demagnetized. Also, a voltage applied to the PMSM may be known when the switching pattern of an inverter is known. Accordingly, if the voltage is used along with the stator winding current, the variations of active/reactive power, magnitude/phase of impedance, and real/imaginary parts of impedance may be calculated, which enables the diagnosis of the demagnetization of the PM. In this case, when a power value or an impedance value calculated using the magnitude of the stator current in respective correspondence with the generation directions of the plurality of magnetic fields does not agree with the predetermined reference value, the PM may be diagnosed as being demagnetized.

As described above, the demagnetization of the PMSM may be diagnosed using the alternating magnetic field or the direct current pulse magnetic field. When the alternating magnetic field is used to diagnose the demagnetization of the PM, two magnetic fields may be generated in opposite directions to each other at certain angles around the rotation axis of the rotor, and two currents flowing in opposite directions to each other in correspondence with the magnetic fields having the opposite direction may be generated in the stator winding. Accordingly, when the initial position of the PM is known, the demagnetization of the PM may be diagnosed at only one generation of the alternating magnetic field. However, when the initial position of the PM is unknown, the alternating magnetic fields have to be generated several times within a range of about 0° to about 180° around the rotation axis of the rotor. Even in this case, when comparing the variation pattern of the difference value between the magnitudes of the currents corresponding to the respective angles with the variation pattern of the current waveforms of the normal PM shown in FIG. 6, the demagnetization of the PM may be more quickly diagnosed.

When the direct current pulse magnetic field is used, the demagnetization of the PM may not be diagnosed until the direction current pulse magnetic field having the direction opposite to the direction of the initially generated direct current pulse magnetic field is generated. Even in this case, when the initial position of the PM is known, the demagnetization of the PM may be diagnosed by generating a direct current pulse magnetic field in the direction of an initial position and in the opposite direction to the direction of initial position. However, when the initial position of the PM is unknown, several direct current pulse magnetic fields should to be generated within a range of about 0° to about 360° around the rotation axis of the rotor 110. Even in this case, when comparing the variation pattern of the difference value of the magnitudes of currents corresponding to respective angle pairs (i.e., arbitrary angle θ° and opposite angle θ°+180° thereof) with the variation pattern of the current waveforms of the normal PM shown in FIG. 6 while sequentially generating magnetic fields having opposite directions to each other, the demagnetization of the PM may be more quickly diagnosed.

As described above, the method of diagnosing the PMSM by applying alternating magnetic fields and direct current pulse magnetic fields has an advantage of diagnosing various defects in addition to the demagnetization diagnosis of the PM, such as defects related to the motor core, the rotor central axis, and eccentricity through analysis of current and power.

Figure 7:
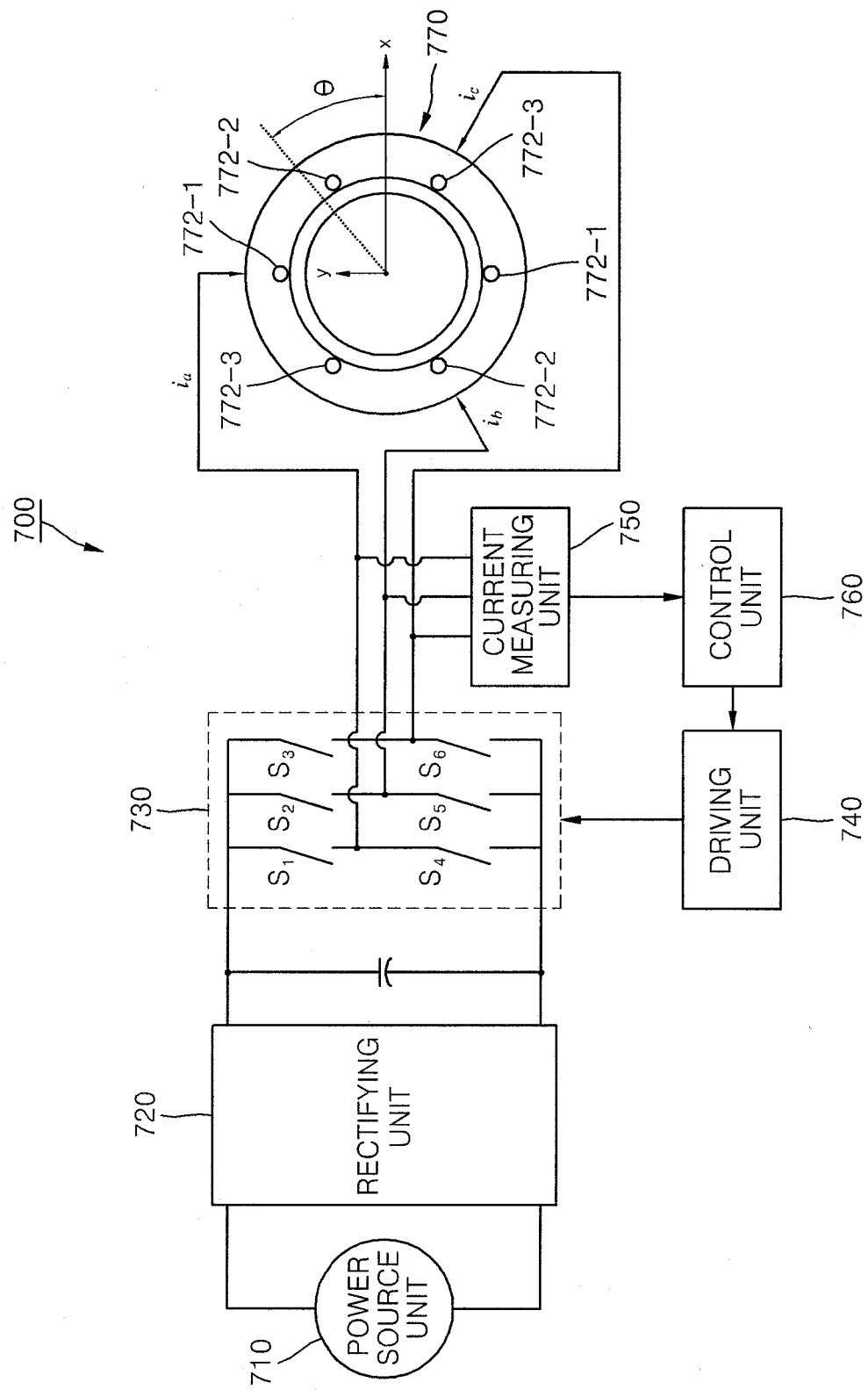
FIG. 7 is a diagram illustrating a driving apparatus of a PMSM, having of the ability to diagnose demagnetization of a PM according to an exemplary embodiment.

FIG. 7 is a diagram illustrating a driving apparatus of a PMSM, possessing the function of diagnosing demagnetization of a PM according to an exemplary embodiment of the present invention.

Referring to FIG. 7, a driving apparatus 700 according to an embodiment of the present invention may include a power source unit 710, a rectifying unit 720, a switching unit 730, a driving unit 740, a current measuring unit 750, and a control unit 760.

The power source unit 710 may supply an alternating current having a fixed frequency to diagnose driving of the motor 770 and for the diagnosis of demagnetization. The rectifier 720 may convert alternating current into direct current. The switching unit 730 may be turned on/off by a driving signal inputted from the driving unit 740 to convert a direct current into an alternating current having a certain frequency and selectively supplies the alternating current to windings (or positions) 772-1 to 772-3 of a stator winding 772 corresponding to respective phases of the motor 770. The switching unit 730 may include six switches S1 to S6. Pairs of switches S1 and S4, S2 and S5, and S3 and S6 connected to each other in series may be connected to both terminals in parallel. When a driving voltage is applied to the stator winding 772-1 to 772-3 corresponding to the respective phases of the motor 770 by on/off switching of the switch pairs S1 and S4, S2 and S5, and S3 and S6; currents ia, ib and ic may flow in the stator winding 772-1 to 772-3. The current measuring unit 750 may measure the currents ia, ib and ic flowing in the stator winding 772-1 to 772-3, and the control unit 760 may output a control signal to the driving unit 740 based on the measured current value inputted from the current measuring unit 750.

Thus, the control unit 760 may perform a series of operations using the measured current value and command speed/torque and then output the control signal to the driving unit 740 to control of the on/off operations of the switching devices. In this case, the control unit 760 may perform different operations according to operation modes. Since the operation of the control unit 760 related to the driving mode of the motor 770 is well-known, a detailed description thereof will be omitted. Hereinafter, the operation of the control unit 760 related to the demagnetization diagnosing mode of the motor 770 will be described in detail. In an embodiment, an alternating magnetic field is applied to the motor 770 using an inverter switch when the motor 770 is stopped. Thereafter, the magnitude of variations of current by saturation are observed to diagnose the demagnetization of the PM. In another embodiment, the alternating magnetic field may be generated in the motor 770 using another device other than the inverter switch. For example, a direct current pulse magnetic field may be generated to diagnose the demagnetization of the PM. Hereinafter, the center of the rotor 774 of the motor 770 will be assumed to be the origin, and the horizontal axis and the vertical axis will be assumed to be the x-axis and the y-axis, respectively.

When the rotor 774 of the motor 770 is at standstill, the control unit 760 may output the control signal to the driving unit 750 to apply an alternating voltage at a certain angle θ° from the x-axis. The driving unit 750 may output a driving signal to control the on/off operation of the respective switches S1 to S6 of the switching unit so that a driving voltage (for example, 100V to the winding 772-1 of stator winding 772 corresponding to the phase A, −80V to the winding 772-2 of stator winding 772 corresponding to the phase B, and −30V to the winding 772-3 of the stator winding 772 corresponding to the phase C) is applied to the stator winding 772-1 to 772-3. According to the switching operation of the switches S1 to S6, alternating magnetic fields may be generated in directions of about θ° and about (θ+180)° in the rotor 774 of the motor 770. In this case, an inverter switch may be provided to first convert an alternating current into a direct current for more accurate control while changing the speed and the torque of the synchronous motor, and may then convert the direct current into an alternating current signal.

The current measuring unit 750 may measure currents flowing in the stator winding 772-1 to 772-3 and provide the measured currents to the control unit 760. Here, the magnitudes of the currents flowing in the stator winding 772-1 to 772-3 may be determined by an interaction between the magnetic field generated by a voltage applied to the stator winding 772-1 to 772-3 and the magnetic field generated by the PM and the saturation of the core. In most PMSMs, the magnetic field generated by the PM is designed to very nearly saturate the core. The control unit 760 may perform an axis transformation for extracting only components of the alternating magnetic field generation directions (i.e., θ° and (θ+180)° from the x-axis) from the respective phase currents, and then calculate the sum of the magnitudes of the axially transformed phase currents corresponding to the respective generation directions so as to set the calculated values to currents corresponding to the respective directions. The control unit 760 may calculate a difference value between the magnitude of the current corresponding to angle θ° and the magnitude of the current corresponding to angle (θ+180)°.

The control unit 760 may control so that the above process is repeatedly performed at certain angles within the range of about θ° to about (θ+180)°. Then control unit 760 may compare the difference values (i.e., the difference values between the magnitudes of the currents that are calculated for angles within the range of about θ° to about (θ+180)° with a variation curve of reference values, where the reference values represent difference values between magnitudes of currents corresponding to a normal PM, such as the curve shown in FIG. 6. A scenario in which the motor 770 is at standstill and the initial position of the PM is rotated by an angle of about a° from the x-axis is now considered. The difference values between the magnitudes of the currents, which are each calculated for their corresponding magnetic field generation angles, will then correspond to the difference values of the normal PM when the variation curve of the reference values (i.e., the difference value between the magnitudes of the currents corresponding to the normal PM shown in FIG. 6) is shifted horizontally to the left by about a°. Accordingly, when the initial position of the PM is known, only one generation of the alternating magnetic field is required in order to diagnose demagnetization of the PM. In the case in which the initial position is not known, the alternating magnetic fields may, in this case, be generated until movement with respect to the variation curve of the reference values (i.e., the difference values between the magnitudes of the currents corresponding to the normal PM shown in FIG. 6) is known.

As described above, the function of diagnosing the demagnetization of the PM may be implemented integrally with driving apparatuses of existing PMSMs, i.e., without requiring additional hardware for diagnosis. It should be noted that even in this case, a direct current pulse magnetic field rather than an alternating magnetic field may be used. When implementing the above described function of diagnosing demagnetization, a method of installing a program in the control unit (i.e., components such as microprocessors for driving the PMSM) may be implemented to perform the above operation while maintaining the hardware for driving existing PMSMs. The switching unit 730 and the driving unit 740 of the driving apparatus 700 of the PMSM described with reference to FIG. 7 may, for example, correspond to the magnetic field generating unit 210 of the PM demagnetization diagnosing apparatus 200 of the PMSM of the present invention described with reference to FIG. 2. Also, the current measuring unit 750 may, for example, correspond to the stator current measuring unit 220, and the control unit 760 may, for example, correspond to the demagnetization diagnosing unit 230. The diagnosis result of the demagnetization of the PM may be outputted by the control unit 760 to the outside through a user interface device (not shown). Examples of such user interface devices include sound output devices for outputting an alarm sound indicating that the PM 140 has been demagnetized and display devices for outputting the degree of demagnetization and demagnetized locations of the PM 140. Furthermore, parameters for driving the PM may also be manually or automatically reset based on the diagnosis result of the demagnetization of the PM by the control unit 760.

Figure 8:
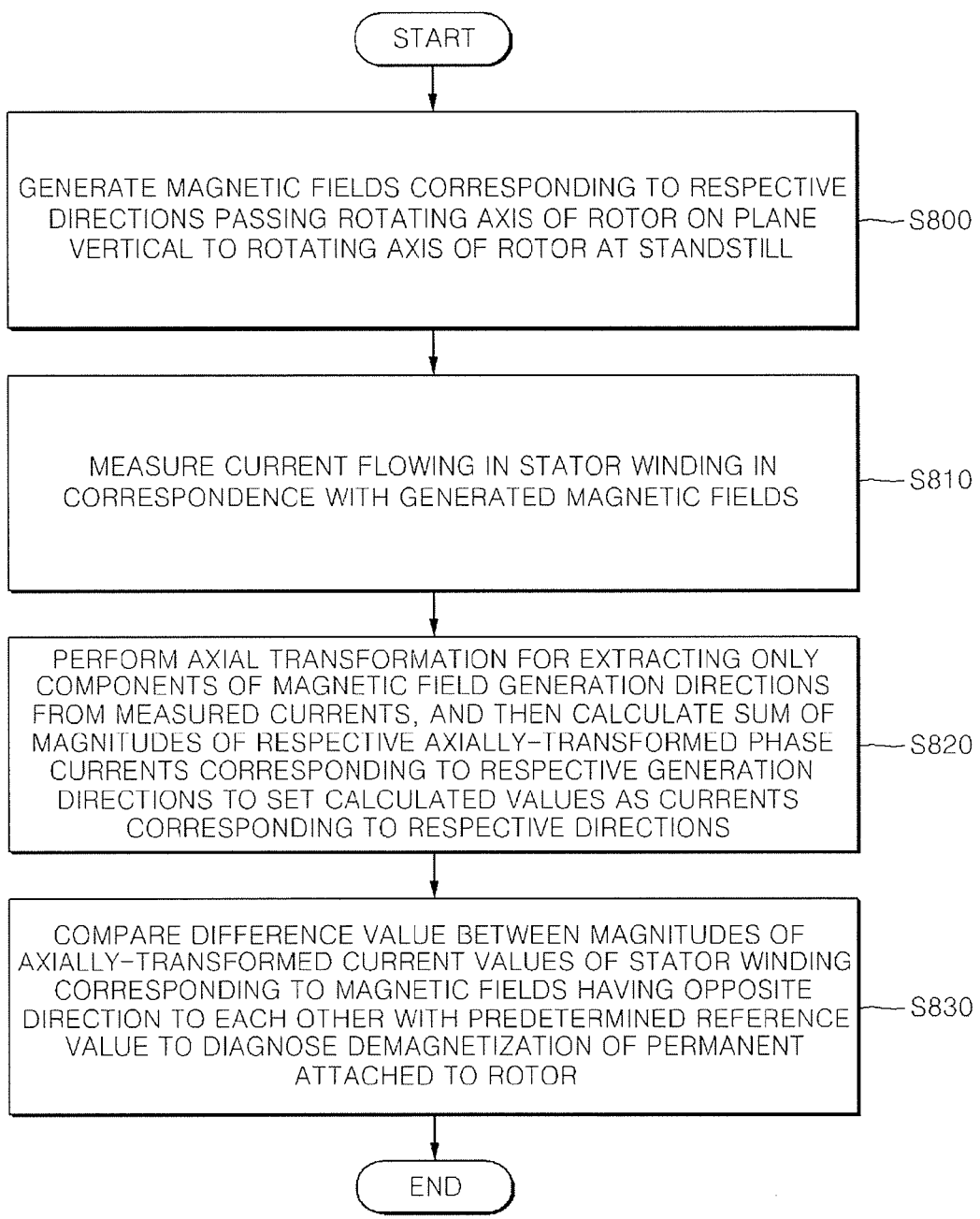
FIG. 8 is a flowchart illustrating a method of diagnosing demagnetization of a PM of a PMSM according to an exemplary embodiment of the present invention.

FIG. 8 is a flowchart illustrating a method of diagnosing demagnetization of a PM of a PMSM according to an embodiment.

Referring to FIG. 8, when the rotor 110 of the PMSM is at standstill, in operation S800, the magnetic field generating unit 210 may generate magnetic fields at predetermined directions corresponding to a plurality of directions passing through the rotation axis of the rotor 110 on a plane vertical to the rotation axis of the rotor 110. In this case, the magnetic field generated by the magnetic field generating unit 210 may be an alternating magnetic field or a direct current pulse magnetic field. In operation S810, the stator current measuring unit 220 may measure currents flowing in the stator winding 130 in correspondence with the respective generated magnetic fields. In operation S820, the demagnetization diagnosing unit 230 may perform an axial transformation for extracting only components of the magnetic field generation directions from the measured currents, and then calculate the sum of the magnitudes of the axially transformed phase currents to set the calculated values to currents corresponding to the magnetic field generation directions. As disclosed above, the magnetic field generation directions may be opposing directions. In operation S830, the demagnetization diagnosing unit 230 may compare the difference value between the magnitudes of the axially transformed current values of the stator winding 130 (which correspond to the magnetic fields having opposite direction to each other) with a predetermined reference value to diagnose the demagnetization of the PM 140 attached to the rotor 110. In this case, the demagnetization diagnosing unit 230 may diagnose the demagnetization of the PM 140 using the average value, specific harmonic components, active/reactive power, and/or impedance of the axially transformed current values.

In embodiments of the present invention, an apparatus and a method for diagnosing permanent magnet demagnetization of a permanent magnet synchronous motor, and an apparatus for driving a permanent magnet synchronous motor, allow for the condition of a permanent magnet in a permanent magnet synchronous motor to be easily diagnosed without separate expensive equipment and disassembly of the motor. Also, since existing hardware resources such as a controller and a current sensor of an inverter for driving such a permanent magnet synchronous motor may be used as they stand, separate hardware is not required to be added. In addition, since demagnetization of a permanent magnet can be diagnosed quickly whenever the permanent magnet synchronous motor is at standstill, demagnetization of a permanent magnet can be promptly and conveniently diagnosed when compared to conventional diagnosing methods that require considerable time and cost. Also, the initial position of a rotor necessary for accurate control of a permanent magnet synchronous motor can be detected without a separate sensor. Furthermore, since demagnetization of a permanent magnet can be diagnosed whenever an alternating magnetic field is generated, defects in the motor core, the rotor central axis, and eccentricity can be additionally diagnosed through analysis of current and power.

The present invention, as described above, may be implemented as computer-readable codes in the computer-readable recording media. The computer-readable recording media include all kinds of recording systems that store data that may be read by the computer systems. Examples of the computer-readable recording media include ROMs, RAMs, CD-ROMs, magnetic tapes, hard disks, floppy disks, and optical data storage devices, and the like, and the computer-readable recording media also include recording systems that are used in the form of carrier waves (for example, transmission through Internet). Also, since the computer-readable recording media are dispersed in the computer systems connected to the computer communication networks, the computer-readable recording media may be stored and implemented as codes that are readable in a dispersion mode.

Although the apparatus and the method for diagnosing permanent magnet demagnetization of a permanent magnet synchronous motor, and the apparatus for driving a permanent magnet synchronous motor have been described with reference to specific embodiments, they are not limited thereto. Therefore, it will be readily understood by those skilled in the art that various modifications and changes can be made thereto without departing from the spirit and scope of the present invention defined by the appended claims.

What is claimed is:

1. An apparatus for diagnosing a permanent magnet demagnetization of a permanent magnet synchronous motor, the apparatus comprising:
   a magnetic field generating unit generating magnetic fields at predetermined directions among a plurality of directions passing through a rotation axis of a rotor, on a plane vertical to the rotation axis of the rotor which is at standstill;
   a stator current measuring unit measuring values of currents which flow in a stator winding in correspondence with the respective generated magnetic fields; and
   a demagnetization diagnosing unit comparing a predetermined reference value and a comparison value which is calculated on the basis of the stator winding currents which are measured in correspondence with respective magnetic fields which are in opposite directions about the rotation axis of the rotor to diagnose demagnetization of a permanent magnet attached to the rotor.

2. The apparatus of claim 1, wherein when the reference value differs from a difference value between magnitudes of the currents which flow in the stator winding and are measured in correspondence with respective magnetic fields which are in opposite directions about the rotation axis of the rotor, the demagnetization diagnosing unit diagnoses the permanent magnet as being demagnetized.

3. The apparatus of claim 1, wherein the comparison value is any one of:
   an average value of magnitudes of the currents which flow in the stator winding and are measured in correspondence with respective magnetic fields which are in opposite directions about the rotation axis of the rotor; harmonic components of a predetermined order for the currents which flow in the stator winding and are measured in correspondence with respective magnetic fields which are in opposite directions about the rotation axis of the rotor; a power value which is calculated on the basis of the currents which flow in the stator winding and are measured in correspondence with respective magnetic fields which are in opposite directions about the rotation axis of the rotor; and an impedance value which is calculated on the basis of the currents which flow in the stator winding and are measured in correspondence with respective magnetic fields which are in opposite directions about the rotation axis of the rotor.

4. The apparatus of claim 1, wherein the magnetic field generating unit generates an alternating magnetic field to generate the respective magnetic fields.

5. The apparatus of claim 4, wherein the magnetic field generating unit generates the magnetic fields at intervals of a certain angle taken clockwise or counterclockwise about the rotation axis of the rotor from a direction of a magnetic field which is initially generated to 180 degrees from the direction of the magnetic field which is initially generated.

6. The apparatus of claim 1, wherein the magnetic field generating unit generates direct current pulse magnetic fields to generate the respective magnetic fields.

7. The apparatus of claim 6, wherein the magnetic field generating unit generates the magnetic fields at intervals of a certain angle taken clockwise or counterclockwise about the rotation axis of the rotor from a direction of a magnetic field which is initially generated to 360 degrees from the direction of the magnetic field which is initially generated.

8. The apparatus of claim 1, wherein the measured values of the stator winding currents are current components and each of the current components corresponds to the direction of a generated magnetic field among the magnetic fields.

9. The apparatus of claim 8, wherein the magnetic field generating unit generates the magnetic fields in certain angle units within a certain angle range about the rotation axis of the rotor until a time when a central location of an N pole of the permanent magnet is checked, the central location of the N pole of the permanent magnet being checked on the basis of change of measured values of the stator winding currents which are measured in correspondence with the magnetic fields which are respectively generated in angle units by the demagnetization diagnosing unit and change of measured values of stator winding currents which are measured in correspondence with magnetic fields which are respectively generated in certain angle units about the rotation axis of the rotor for a normal permanent magnet.

10. A method for diagnosing a permanent magnet demagnetization of a permanent magnet synchronous motor, the method comprising:
   generating magnetic fields at predetermined directions among a plurality of directions passing through a rotation axis of a rotor, on a plane vertical to the rotation axis of the rotor which is at standstill;
   measuring currents which flow in a stator winding in correspondence with the respective generated magnetic fields; and
   comparing a predetermined reference value and a comparison value which is calculated on the basis of the stator winding currents which are measured in correspondence with respective magnetic fields which are in opposite directions about the rotation axis of the rotor to diagnose demagnetization of a permanent magnet attached to the rotor.

11. The method of claim 10, wherein the comparing of a predetermined reference value and a comparison value comprises: diagnosing the permanent magnet as being demagnetized, when the reference value differs from a difference value between magnitudes of the currents which flow in the stator winding and are measured in correspondence with respective magnetic fields which are in opposite directions about the rotation axis of the rotor.

12. The method of claim 10, wherein the comparison value is any one of an average value of magnitudes of the currents which flow in the stator winding and are measured in correspondence with respective magnetic fields which are in opposite directions about the rotation axis of the rotor, harmonic components of a predetermined order for the currents which flow in the stator winding and are measured in correspondence with respective magnetic fields which are in opposite directions about the rotation axis of the rotor, a power value which is calculated on the basis of the currents which flow in the stator winding and are measured in correspondence with respective magnetic fields which are in opposite directions about the rotation axis of the rotor, and an impedance value which is calculated on the basis of the currents which flow in the stator winding and are measured in correspondence with respective magnetic fields which are in opposite directions about the rotation axis of the rotor.

13. The method of claim 10, wherein an alternating magnetic field or direct current pulse magnetic fields are generated to generate the respective magnetic fields.

14. The method of claim 10, wherein the measured values of the stator winding currents are current components and each of the current components corresponds to the direction of a generated magnetic field among the magnetic fields.

* * * * *